Figure 1:
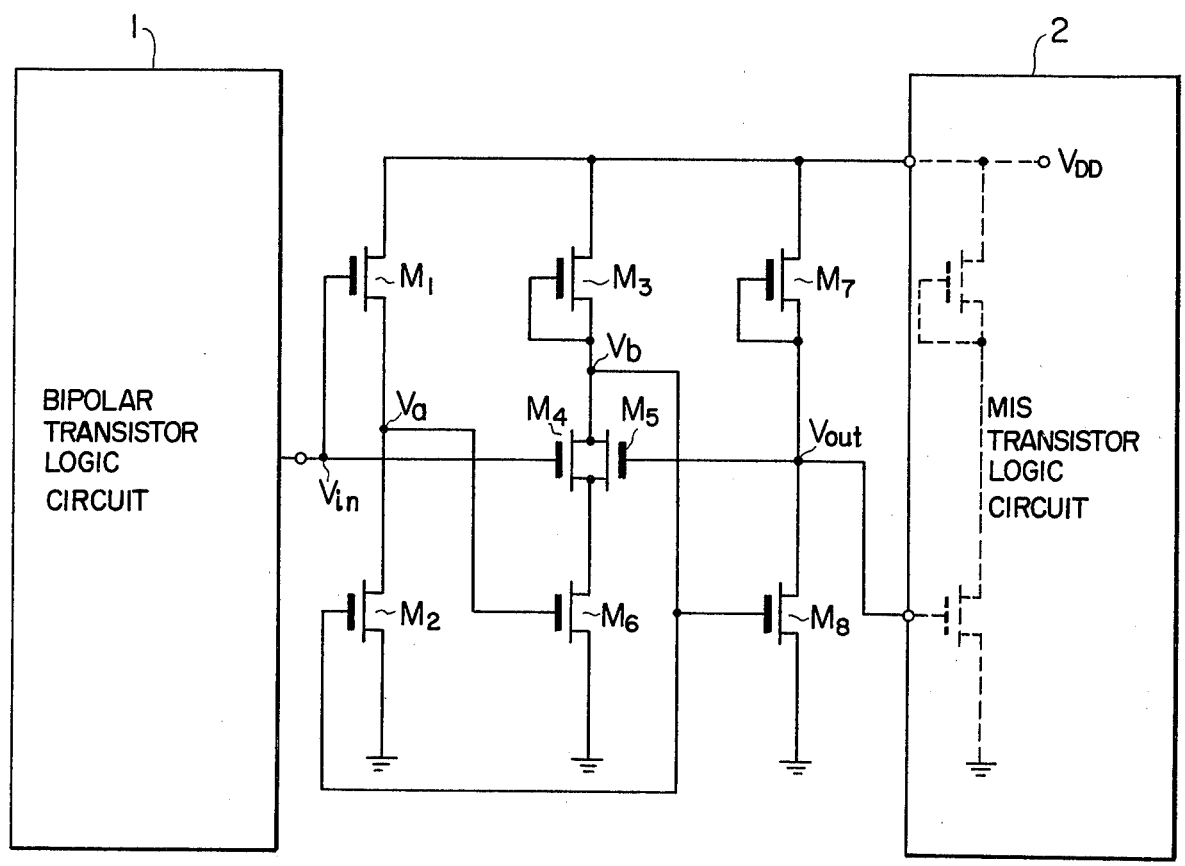

United States Patent
Shimada et al.

[11] 4,031,409
[45] June 21, 1977

[54] SIGNAL CONVERTER CIRCUIT

[75] Inventors: Shunji Shimada, Kodaira; Harumi Wakimoto, Hino, both of Japan

[73] Assignee: Hitachi, Ltd., Japan

[22] Filed: May 26, 1976

[21] Appl. No.: 689,966

[30] Foreign Application Priority Data

May 28, 1975  Japan ............................. 50-62897

[52] U.S. Cl. .................................. 307/208; 307/205; 307/264; 307/270; 307/DIG. 1
[51] Int. Cl.² .................. H03K 3/353; H03K 19/08
[58] Field of Search .......... 307/205, 208, 251, 264, 307/268, 270, DIG. 1, 304

[56] References Cited

UNITED STATES PATENTS

| | | | |
|---|---|---|---|
| 3,612,908 | 10/1971 | Heimbigner | 307/251 X |
| 3,835,457 | 9/1974 | Yu | 307/DIG. 1 X |
| 3,859,641 | 1/1975 | Clemons et al. | 307/DIG. 1 X |
| 3,900,746 | 8/1975 | Kraft et al. | 307/DIG. 1 X |
| 3,906,254 | 9/1975 | Lane et al. | 307/264 X |
| 3,916,430 | 10/1975 | Heuner et al. | 307/270 X |
| 3,925,689 | 12/1975 | Rubenstein | 307/DIG. 1 X |

OTHER PUBLICATIONS

AOKI et al., "Field-Effect Transistor Driver Circuit"; *IBM Tech. Discl. Bull.;* vol. 17, No. 7, pp. 2066–2067; 12/1974.

*Primary Examiner*—John S. Heyman
*Assistant Examiner*—Larry N. Anagnos
*Attorney, Agent, or Firm*—Craig & Antonelli

[57] ABSTRACT

A signal converter circuit for converting a binary signal delivered from a bipolar transistor logic circuit into another binary signal adapted for application to a MIS transistor logic circuit. The converter circuit comprises first, second and third stages; the first stage includes a source follower circuit, the second stage includes a series connection of a pair of parallel-connected MIS FETs and a switching MIS FET, and the third stage includes an inverter circuit. The output of the third stage is fed back to the gate of one of the pair of MIS FETs in the second stage so that the converter output has binary levels acceptable to a MIS logic circuit.

3 Claims, 3 Drawing Figures

SIGNAL CONVERTER CIRCUIT

The present invention relates to a logic current in which MIS transistors (insulated gate type field effect transistor) and in particular to a converter circuit for converting a binary output signal from a bipolar transistor logic circuit to a binary signal suited to be inputted to a MIS transistor logic circuit.

In general, in a digital information processing apparatus, the processing as well as the display of information are performed with the aid of a binary signal composed of logical 1 and 0 in most cases. The devices destined for such processing and display of the information are usually realized in integrated circuit form.

With such integrated circuits, transference of binary signal levels is often required for interconnecting the various types of logic circuits, since the binary signal levels of the input and output signals with which the logic circuits satisfactorily operate are different in dependence of their types. For example, in the case of a logic circuit including bipolar transistors such as TTL (transistor-transistor logic), the minimum logical 1 output voltage is usually about 2.4V while the maximum logical 0 output voltage is usually about 0.4V. On the other hand, in the case of a MIS logic circuit, the actual binary signal levels corresponding to logical 1 and logical 0 are usually not lower than 3V and not higher than 2V, respectively. Accordingly, in order to interconnect these two types of circuits, the output signal from the TTL circuit has to be converted into a binary level signal which is suited or acceptable to be inputted to the MIS circuit. Such requirement is prominent particularly in a microcomputer.

For the signal conversion as described above, it has been hitherto known as an expedient that a resistor is externally provided between one of the output terminals of the TTL circuit and a power soource terminal. However, in the case of LSIs (large scale integrated circuit), the provision of an external resistor circuit is undesirable from the standpoint that attempt has been made to enhance the integration density.

Accordingly, a primary object of the present invention is to provide a converter circuit for converting a binary output signal from a bipolar transistor logic circuit into a binary signal suited to be inputted to a MIS transistor logic circuit.

Another object of the invention is to provide a converter circuit of the above described type which can be conveniently realized in a form of an integrated circuit.

Figure 2A:
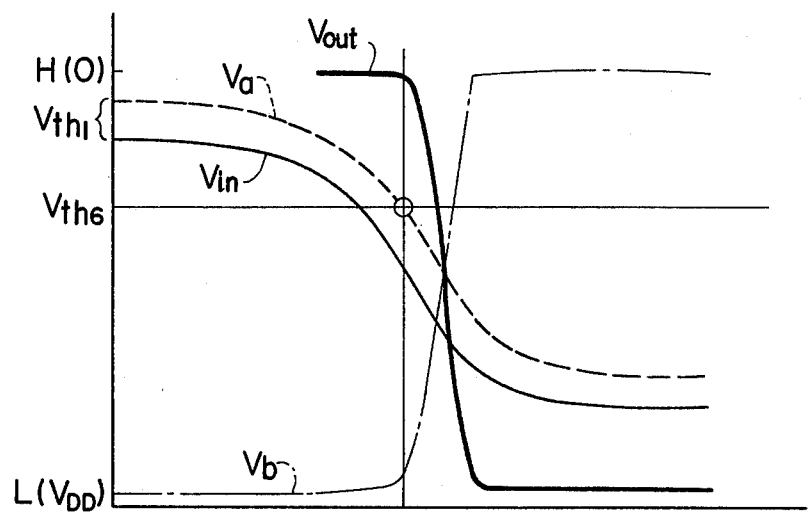
Figure 2B:
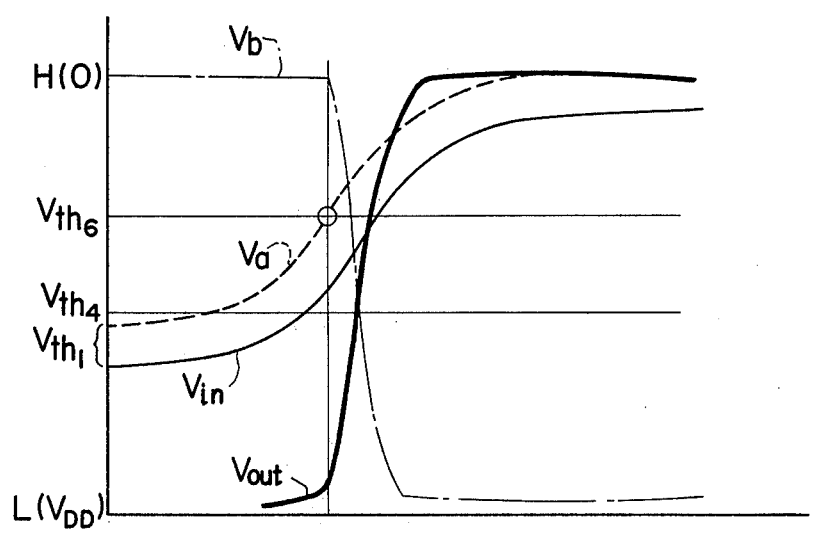

The above and other objects, novel features and advantages of the invention will become more apparent from the following description of a preferred embodiment of the invention made in conjunction with the accompanying drawings, in which:

FIG. 1 is a circuit diagram of a signal converter circuit according to an embodiment of the invention; and FIGS. 2a and 2b show waveforms of signals appearing at some parts of the converter circuit shown in FIG. 1.

The construction of a signal converter circuit according to one embodiment of the invention will be described with reference to FIG. 1. As can be seen from the figure, the first stage of the signal converter circuit comprises a source-follower circuit including MIS insulated gate type field effect transistors (hereinafter referred to simply as FET) $M_1$ and $M_2$. The FET $M_1$ is of enhancement type with its drain connected to a terminal $V_{DD}$ of a power source. The FET $M_2$ which is also of enhancement type serves as a load for the FET $M_1$ and has its drain connected to source of the FET $M_1$. The source of FET $M_2$ is connected to a suitable common potential line such as ground. The gate of the FET $M_1$ is arranged to receive a binary output signal from a logic circuit 1 including bipolar transistors, for example.

The second stage of the converter circuit includes a load $M_3$, a parallel connection of FETs $M_4$ and $M_5$, and a switching FET $M_6$. In this embodiment, the load $M_3$ consists of a depletion type FET having its drain connected to the power source terminal $V_{DD}$ and its source connected to the drains of the FETs $M_4$ and $M_5$. The FETs $M_4$, $M_5$ and $M_6$ are all of enhancement type. The FET $M_6$ has its drain connected to the sources of the FETs $M_4$ and $M_5$ and its gate connected to the output of the source-follower circuit constituting the first stage, i.e. the junction between the FETS $M_1$ and $M_2$. The source of the FET $M_6$ is connected to a common potential or ground. The gate of the FET $M_4$ is connected to the gate of FET $M_1$ in the first stage so that the output from the bipolar transistor logic circuit 1 is applied also to the FET $M_4$. The third stage includes an inverter circuit having a load $M_7$ and a FET $M_8$. In the illustrated embodiment, the load $M_7$ is a depletion type FET having its drain connected to the power source terminal $V_{DD}$ and its source connected to the gate of FET $M_7$ and to the drain of the FET $M_8$ which is of enhancement type. The gate of the FET $M_8$ is connected to the drains of FETs $M_4$ and $M_5$ in the second stage and additionally to the gate of the FET $M_2$ in the first stage, while the source of the FET $M_8$ is connected to the common potential line or ground. The gate of the FET $M_5$ in the second stage is connected to the junction between the FETS $M_7$ and $M_8$ of the third stage. The output of the converter circuit is derived from the connection or junction between the FETs $M_7$ and $M_8$ of the third stage and supplied to a MIS transistor logic circuit 2.

Next, the operation of the converter circuit shown in FIG. 1 will be described with reference to FIGS. 2a and 2b. In the following description, it is assumed that all the FETs are p-channel FET and the potential at the power source terminal $V_{DD}$ is negative. Accordingly, the ground potential correspoinds to high level H, while the power source potential at $V_{DD}$ corresponds to low level L.

(1). OPERATION WHEN THE EXTERNAL INPUT $V_{IN}$ GOES NEGATIVE FROM H TO L LEVEL

As shown in FIG. 2a, when the external input (the output from the logic circuit 1) goes negative progressively toward L level from H level as indicated by the output voltage waveform $V_{in}$, the voltage $V_a$ at the source of the FET $M_1$ constituting the source-follower circuit will vary along a waveform curve (broken line curve in FIG. 2a) which is transferred toward H level by $V_{th1}$, the value of threshold voltage of the FET $M_1$. respect of its potential level by the source-follower circuit.

When the output voltage $V_a$ of the source-follower circuit exceeds the threshold voltage $V_{th6}$ of the FET $M_6$ in the second stage, the FET $M_6$ is turned on along with the FET $M_4$, since the input signal $V_{in}$ is applied also to the FET $M_4$ in the second stage. In this connection, the FET $M_3$ may be regarded as a load having a certain constant impedance, since the FET $M_3$ is of depletion type. At the time when the FETs $M_4$ and $M_6$ are turned on, the voltage $V_b$ at the source of the FET load $M_3$ rises from the level L to H (chain line curve in FIG. 2a). The driving FET $M_8$ of the inverter in the third stage is turned off in response to the voltage $V_b$ going up from L to H level. As a result, the voltage $V_{out}$ at the output of the inverter, that is, at the drain of FET $M_8$ goes down or negative from H to L level. In other words, the voltage $V_{out}$ takes a waveform corresponding to the inverted waveform of $V_b$. The FET $M_7$ may be regarded as a load having a certain constant impedance, since the FET $M_7$ is of depletion type. As the output voltage $V_{out}$ is fed back to the FET $M_5$ in the second stage, the FET $M_5$ connected to the source of the FET load $M_3$ in the second stage is turned on by the output voltage $V_{out}$ which is at L level at this time point. Accordingly, the resistance of the parallel connection of the FET $M_4$ having been already turned on by the input voltage $V_{in}$ and the FET $M_5$ having been just turned on by the output voltage $V_{out}$ is decreased, which causes the voltage $V_b$ at the drains of FETs $M_4$ and $M_5$ to rise increasingly toward the H level. This in turn causes the driving FET $M_8$ of the inverter circuit in the third stage to become more nonconductive, whereby the voltage $V_{out}$ at the output point falls rapidly (as indicated by thick solid line curve in FIG. 2a). In this manner, there can be obtained the output voltage $V_{out}$ which is in phase with the input voltage $V_{in}$ and has required high and low levels H and L after having been shaped in the waveform.

(2). OPERATION WHEN THE EXTERNAL INPUT $V_{IN}$ GOES POSITIVE FROM L TO H LEVEL

As is shown in FIG. 2b, when the external input $V_{in}$ (output from the logic circuit 1) goes positive progressively toward H level from the L level as indicated by the output voltage waveform $V_{in}$, the voltage $V_a$ of a waveform which has been transferred in the level by the source-follower circuit in the first stage as described hereinbefore in connection with the operation (1) can be obtained (as indicated by broken line curve in FIG. 2b). Further, a voltage having waveform $V_b$ (as indicated by chain line curve in FIG. 2b) and the shaped output voltage $V_{out}$ which is in phase with the input voltage $V_{in}$ and has required H and L levels (as indicated by thick solid line curve in FIG. 2b) can be obtained through the inverse process of changes between high and low levels relative to that of the aforementioned operation (1). In connection with the operation (2), it is noted that since the threshold voltage $V_{th4}$ of the FET $M_4$ connected in parallel with the FET $M_5$ in the second stage is higher than that of the FET $M_6$, the FET $M_4$ is turned on earlier than the FET $M_6$, whereby the output signal $V_{out}$ can rise rapidly to improve the waveform shaping function.

Further, due to such arrangement that the source voltage $V_b$ of the FET load $M_3$ in the second stage is fed back to the gate of the FET load $M_2$ of the source-follower circuit in the first stage, the FET $M_2$ can be operated in a manner complementary to the FET $M_1$ which is supplied with the input $V_{in}$. Thus, the FET $M_6$ which is supplied with the output voltage $V_a$ from the source-follower circuit can be turned on in the case of the operation (1) or off in the case of the operation (2) without fail.

Thus, a converter circuit suited to be realized in a form of a MIS integrated circuit has now been provided which is capable of converting the output from the logic circuit comprising bipolar transistors to a signal having binary levels and suited to be inputted to the MIS transistor logic circuit.

Since the signal converter circuit according to the invention has a function to improve the signal waveform or to wave-shape in addition to the level transferring function, the transfer characteristic of the converter circuit is also advantageously improved.

The invention is never restricted to the above described embodiment. Many modifications and changes are possible without departing from the spirit of the invention.

For example, the FET load $M_2$ of the source-follower circuit in the first stage may be either of enhancement or depletion type. However, it is pointed out that the use of the enhancement type FET will reduce the powe consumption. In place of the FET, a diffused resistor may be employed. However, the use of a FET is preferred, since the noise margin can be enhanced by feeding back the voltage $V_b$ to the FET.

Additionally, the FET load $M_3$ in the second stage as well as $M_7$ in the third stage may be of enhancement type.

In the above described embodiment, it has been assumed that all the FETs are of p-channel type. However, it is of course possible to use FETs of n-channel type.

We claim:
1. A signal converter circuit comprising:
   a first stage including a source follower circuit having a MIS FET and a first load connected to the source of the MIS FET, the gate of said MIS FET being arranged for reception of an input to the signal converter cicuit;
   a second stage including a pair of MIS FETs having their drains connected to each other and their sources connected to each other, a switching MIS FET having its drain connected to the sources of said pair of MIS FETs and its gate connected to the output of said source follower circuit, and a second load connected to the drains of said pair of MIS FETs; and
   a third stage including an inverter circuit having a MIS FET and a third load connected to the drain of the MIS FET, the gate of the MIS FET in said third stage being connected to the drains of said pair of MIS FETs in said second stage;
   the gate of one of said pair of MIS FETs in said second stage being connected to the gate of the MIS FET in said first stage while the gate of the other of said pair of MIS FETs being connected to the drain of the MIS FET in said third stage.
2. A signal converter circuit according to claim 1, in which each of said second and third loads are constituted by a depletion type MIS FET having its gate and source connected to each other, the source of said second load MIS FET being connected to the drains of said pair of MIS FETs in said second stage while the source of the third load MIS FET being connected to the drain of the MIS FET in said third stage.
3. A signal converter circuit according to claim 2, in which said first load is constituted by an enhancement type MIS FET having its drain connected to the source of the MIS FET in said first stage and its gate connected to the drains of said pair of MIS FETs in said second stage.

* * * * *